US009695816B2

(12) United States Patent
Pan et al.

(10) Patent No.: US 9,695,816 B2
(45) Date of Patent: Jul. 4, 2017

(54) FLUID DETECTION APPARATUS AND FLUID DETECTION METHOD

(71) Applicant: Tatung Company, Taipei (TW)

(72) Inventors: Tai-Jee Pan, Taipei (TW); Chih-Jou Lin, Taipei (TW); Jia-Ching Lin, Taipei (TW)

(73) Assignee: Tatung Company, Taipei (TW)

( * ) Notice: Subject to any disclaimer, the term of this patent is extended or adjusted under 35 U.S.C. 154(b) by 60 days.

(21) Appl. No.: 14/801,856

(22) Filed: Jul. 17, 2015

(65) Prior Publication Data

US 2016/0290332 A1  Oct. 6, 2016

(30) Foreign Application Priority Data

Mar. 30, 2015  (TW) .............................. 104110296 A

(51) Int. Cl.
| | |
|---|---|
| *G01N 7/22* | (2006.01) |
| *F04B 51/00* | (2006.01) |
| *G01M 3/04* | (2006.01) |
| *G01M 3/16* | (2006.01) |
| *G01M 3/18* | (2006.01) |

(Continued)

(52) U.S. Cl.
CPC ............ *F04B 51/00* (2013.01); *G01F 23/265* (2013.01); *G01M 3/04* (2013.01); *G01M 3/165* (2013.01); *G01M 3/18* (2013.01); *G01R 31/40* (2013.01)

(58) Field of Classification Search
CPC ....... F04B 51/00; F16K 37/0075; G01N 3/12; F02M 65/00

USPC ......................................... 73/168, 37, 114.41
See application file for complete search history.

(56) References Cited

U.S. PATENT DOCUMENTS

| | | | | |
|---|---|---|---|---|
| 3,824,460 | A | * | 7/1974 | Gustafson ............. G01F 23/265 324/664 |
| 4,819,483 | A | | 4/1989 | Emplit et al. |
| 8,358,216 | B2 | | 1/2013 | Du et al. |

(Continued)

FOREIGN PATENT DOCUMENTS

| | | |
|---|---|---|
| CN | 101476917 | 7/2009 |
| CN | 202304947 | 7/2012 |

(Continued)

OTHER PUBLICATIONS

"Office Action of European Patent Office Counterpart Application", issued on Aug. 22, 2016, p. 1-p. 10.

(Continued)

*Primary Examiner* — Michael A Lyons
*Assistant Examiner* — Nigel Plumb
(74) *Attorney, Agent, or Firm* — Jianq Chyun IP Office

(57) ABSTRACT

A fluid detection apparatus and a fluid detection method are provided. The fluid detection apparatus includes a plurality of capacitive detection units and a sensing circuit. The capacitive detection units are sequentially arranged along a detection direction, wherein each of the capacitive detection units generates an impedance variation in response to the submergence of the fluid and accordingly generates a corresponding fluid detection signal. The sensing circuit is coupled to the capacitive detection units so as to receive the fluid detection signals and send a first status indication signal indicating a spread circumstance of the fluid along the detection direction according to the fluid detection signals.

12 Claims, 5 Drawing Sheets

(51) Int. Cl.
*G01F 23/26* (2006.01)
*G01R 31/40* (2014.01)

(56) References Cited

U.S. PATENT DOCUMENTS

| | | | |
|---|---|---|---|
| 2009/0115433 A1* | 5/2009 | Bier | G01M 3/18 |
| | | | 324/693 |
| 2011/0295504 A1* | 12/2011 | Barber | G01M 3/045 |
| | | | 702/3 |
| 2013/0269419 A1* | 10/2013 | Etherington | G01F 1/692 |
| | | | 73/37 |

FOREIGN PATENT DOCUMENTS

| | | |
|---|---|---|
| DE | 3503800 A1 | 8/1986 |
| DE | 3539946 A1 | 5/1987 |
| TW | M469480 | 1/2014 |
| WO | 02082034 A2 | 10/2002 |
| WO | 2007006747 A1 | 1/2007 |
| WO | 2010046886 A2 | 4/2010 |
| WO | 2013146535 | 10/2013 |

OTHER PUBLICATIONS

"Office Action of Taiwan Counterpart Application", issued on Sep. 23, 2015, p. 1-p. 6.

* cited by examiner

FLUID DETECTION APPARATUS AND FLUID DETECTION METHOD

CROSS-REFERENCE TO RELATED APPLICATION

This application claims the priority benefit of Taiwan application serial no. 104110296, filed on Mar. 30, 2015. The entirety of the above-mentioned patent application is hereby incorporated by reference herein and made a part of this specification.

BACKGROUND OF THE INVENTION

Field of the Invention

The invention relates to a fluid detection apparatus and a fluid detection method, and more specifically, to a fluid detection apparatus that is able to detect a spread circumstance of a fluid and a fluid detection method.

Description of Related Art

Generally in basement planning, a pump is usually utilized to prevent leaking and flooding so that accumulating water is rapidly pumped out of the basement, and thus, property damage is also prevented.

More specifically, the pump is generally installed inside a trough-shaped region which is below the ground. When the leaking and flooding circumstance happen in the basement, a water level inside the trough-shaped region increases gradually. In normal operating condition, when the water level reaches a specific preset height, the pump starts to operate and the water is pumped out of the trough-shaped region through a pipeline. Therefore, the water level inside the trough-shaped region decreases to be within the normal range.

However, under condition that the pump malfunctions, the pump couldn't start when the water level reaches the preset height. Therefore, the accumulating water couldn't be disposed of immediately and the user couldn't be aware of the malfunction of the pump so that flooding circumstance happens eventually.

SUMMARY OF THE INVENTION

The invention provides a fluid detection apparatus and a fluid detection method that could detect an abnormal spread circumstance of a fluid and could issue an alarm immediately to notice the user.

The fluid detection apparatus of the invention includes a plurality of capacitive detection units and a sensing circuit. The capacitive detection units are sequentially arranged along a detection direction, wherein each of the capacitive detection units generates an impedance variation in response to a submergence of a fluid and accordingly generates a corresponding fluid detection signal. The sensing circuit is coupled to the capacitive detection units so as to receive the fluid detection signals, and emits a first status indication signal indicating a spread circumstance of the fluid along the detection direction according to the fluid detection signals.

In one embodiment of the invention, the fluid detection apparatus further includes a detection carrier. The capacitive detection units are sequentially disposed on the detection carrier based on a preset interval.

In one embodiment of the invention, the fluid detection apparatus further includes an environment detection unit. The environment detection unit is disposed on the detection carrier and coupled to the sensing circuit. In addition, the environment detection unit is configured to detect an environmental condition and generate an environment detection signal, wherein the sensing unit in accordance with the environment detection signal emits a second status indication signal indicating that whether the environmental condition exceeds a critical condition.

In one embodiment of the invention, the fluid detection apparatus further includes a status alert module. The status alert module is coupled to the sensing circuit and configured to decide whether to emit an alarm according to at least one of the first status indication signal and the second status indication signal.

In one embodiment of the invention, the fluid detection apparatus further includes a smart power supply. The smart power supply is coupled to the sensing circuit. In addition, the smart power supply is configured to supply power to a fluid regulating apparatus and to detect a power supply condition so as to determine whether the fluid regulating apparatus is in a normal operating condition.

In on embodiment of the invention, the smart power supply decides whether to reset so as to restart the fluid regulating apparatus according to the first status indication signal and the power supply condition.

In one embodiment of the invention, the smart power supply emits an alarm signal when the smart power supply determines that the fluid regulating apparatus is not in the normal operating condition after reset.

In the present embodiment of the invention, the smart power supply includes a power supply unit, a relay, a control unit, and a communication unit. The power supply unit is configured to supply power to the fluid regulating apparatus. The relay is coupled between the power supply unit and the fluid regulating apparatus. The relay controls a switching signal to decide whether an operation power is provided to the fluid regulating apparatus. The control unit is coupled to the sensing circuit, the fluid regulating apparatus, and the relay. The control unit is configured to detect the power supply condition that is provided for the fluid regulating apparatus, and to emit the alarm signal and the switching signal according to the power supply condition and the first status indication signal. The communication unit is coupled to the control unit and configured to transmit the alarm signal by the wired or wireless communication method.

In the present embodiment of the invention, the sensing circuit calculates the time difference of the fluid flowing through two of the capacitive detection units according to the fluid detection signals and generates a third status indication signal of the spread rate of the indicated fluid.

A fluid detection method of the invention is applied for a fluid detection apparatus, the fluid detection apparatus includes a plurality of capacitive detection units and a sensing circuit. The fluid detection method includes the following steps: generating an impedance variation in response to a submergence of a fluid and accordingly generating a corresponding fluid detection signal via each of the capacitive detection units; receiving the fluid detection signals via the sensing circuit; and emitting a first status indication signal indicating a spread circumstance of the fluid along a detection direction according to the fluid detection signals.

In one embodiment of the invention, the fluid detection apparatus further includes an environment detection unit, and the fluid detection method further includes the following steps: detecting an environmental condition and generating an environment detection signal via the environment detection unit; receiving the environment detection signal via the sensing unit; and emitting a second status indication signal indicating whether the environmental condition exceeds a critical condition in accordance with the environment detection signal.

In one embodiment of the invention, the fluid detection method further includes the following step: deciding whether to emit an alarm according to at least one of the first status indication signal and the second status indication signal.

In one embodiment of the invention, the fluid detection apparatus further includes a smart power supply, and the fluid detection method further includes the following steps: supplying power to a fluid regulating apparatus and receiving the first status indication signal via the smart power supply; detecting a power supply condition of the smart power supply; determining whether the fluid regulating apparatus being in the normal operating condition; and emitting an signal after the smart power supply is reset if the condition that the fluid regulating apparatus is not in the normal operating condition is determined.

In one embodiment of the invention, the fluid detection method further includes the following steps: calculating a time difference of the fluid flowing through two of the capacitive detection units via the sensing circuit; and generating the third status indication signal indicating a spread velocity of the fluid according to the time difference.

Based on the above, the embodiment of the invention provides the fluid detection apparatus including capacitive detection units and the fluid detection method. The capacitive detection units are sequentially arranged along a specific detection direction and able to react to the submergence of the fluid, so that the capacitive detection units are able to generate an impedance variation. All the returned fluid detection signals of the capacitive detection units are sensed to achieve the detection of the spread circumstance of the fluid. In addition, through detecting the spread circumstance of the fluid and detecting the power supply condition, the fluid detection apparatus and the fluid detection method of the embodiments of the invention could further determine punctually and accurately that whether the pump of the fluid regulating apparatus is in the malfunction condition.

In order to make the aforementioned and other features and advantages of the invention more comprehensible, embodiments accompanying figures are described in detail belows.

DESCRIPTION OF THE EMBODIMENTS

Figure 1:
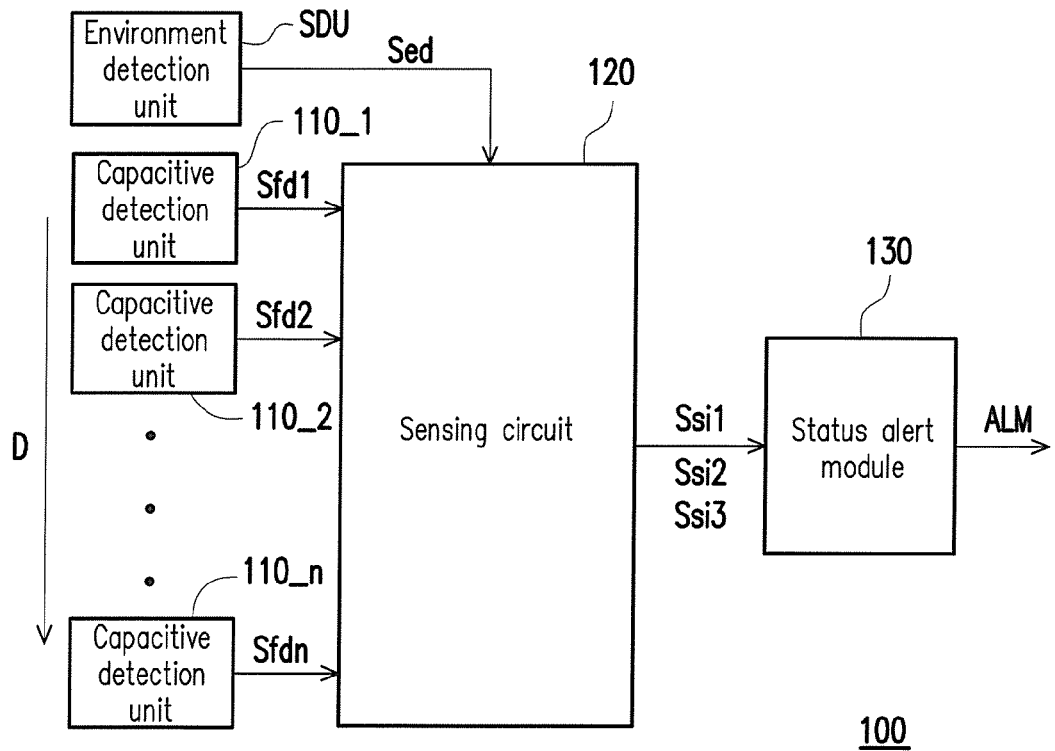
FIG. 1 is a schematic diagram of a fluid detection apparatus of one embodiment of the invention.

The accompanying drawings are included to provide a further understanding of the invention, and are incorporated in and constitute a part of this specification. The drawings illustrate embodiments of the invention and, together with the description, serve to explain the principles of the invention. Wherever possible, the same reference numbers are used in the drawings and the description to refer to the same or like parts.

FIG. 1 is a schematic diagram of a fluid detection apparatus of one embodiment of the invention. Referring to FIG. 1, a fluid detection apparatus 100 of this embodiment could detect a fluid condition under a specific environment, for example, a flowing condition and a spreading condition of the fluid. The fluid herein means any kinds of gas or liquid, which can be deformed continuously by the shearing stress, have flowability, diffusibility, spreadability, and the deformation may lead the equivalent impedance being varied, such as water or oil, but the invention is not limited thereto.

In the present embodiment, the fluid detection apparatus 100 includes a plurality of capacitive detection units 110_1~110_$n$ (n≥2 and n is an integer and is defined by the designer, but the invention is not limited thereto), a sensing circuit 120, a status alert module 130, and an environment detection unit SDU. The capacitive detection units 110_1~110_$n$ are sequentially arranged along a detection direction D (the detection direction D is illustrated a direction from up to down in the figure, but the invention is not limited thereto). Each of the capacitive detection units 110_1~110_$n$ generates an impedance variation in response to a submergence of the fluid and accordingly generates a corresponding fluid detection signal Sfd1~Sfdn to provide for the sensing circuit 120.

The sensing circuit 120 is coupled to the capacitive detection units 110_1~110_$n$ so as to receive the fluid detection signals Sfd1~Sfdn. In the present embodiment, the sensing circuit 120 calculates a spread circumstance of the fluid along the detection direction D according to the fluid detection signals Sfd1~Sfdn, so as to generate a first status indication signal Ssi1 indicating the spread circumstance of the fluid.

The status alert module 130 is coupled to the sensing circuit 120 and configured to decide whether to emit an alarm ALM according to the first status indication signal Ssi1 receiving from the sensing circuit 120. The alarm ALM could be, for example, light alarm, sound alarm, or any type of warning means that could make the user aware of the occurring condition, but the invention is not limited thereto.

The environment detection unit SDU is coupled to the sensing circuit 120. In addition, the environment detection unit SDU is configured to detect an environmental condition (e.g., temperature, humidity, smoke, or any related environmental condition, but the invention is not limited thereto) and generate an environment detection signal Sed. The sensing unit 120 emits a second status indication signal Ssi2, indicating whether the environmental condition exceeds a critical condition, to provide for the status alert module 130 according to the received environment detection signal Sed. Therefore, the status alert module 130 could further decide whether to emit the alarm ALM according to the second status indication signal Ssi2.

To be specific, the fluid detection apparatus 100 could be applied in many different situations, such as, it could be installed in a basement, a water tower, a tank of a washing machine, or underground. Herein, the condition for emitting the alarm ALM can be defined by the user, such that the alarm ALM can be emitted by the fluid detection apparatus 100 when the spread circumstance of the fluid is abnormal.

For example, the alarm condition can be defined as the alai in ALM is triggered when the fluid spreads to cover three or more of the capacitive detection units 110_1~110_n. Under the condition, the sensing circuit 120 determines whether the impedance of three capacitive detection units varies at the same time according to the fluid detection signals Sfd1~Sfdn. If the sensing circuit 120 determines that there are three capacitive detection units having impedance variation, it represents that the fluid at least spreads over the intervals covered by 3 capacitive detection units. Therefore, the sensing circuit 120 emits the first status indication signal Ssi1 to the status alert module 130, such that the status alert module 130 emits the alarm ALM such as the flash alarm or the sound alarm according to the first status indication signal Ssi1. The user can be noted about the abnormal spread circumstance of the fluid at the environment that the fluid detection apparatus 100 is installed.

In addition, through the installation of the environment detection unit SDU, the fluid detection apparatus 100 could not only detect the spread circumstance of the fluid under a specific environment but also detect whether the environmental temperature and/or humidity exceeds a preset value or detect the production of smoke, so as to generate the second status indication signal Ssi2 indicating the environmental condition. Therefore, the back-end circuit may execute the alarm emitting or other warning means to notice the user that there is an abnormal condition in the environment which the fluid detection apparatus 100 is installed.

Furthermore, the fluid detection apparatus 100 of this embodiment could detect not only the spread circumstance of the fluid under a specific environment but also a spread velocity of the fluid. In a exemplary embodiment, the sensing circuit 120 calculates a time difference of the fluid flowing between two of the capacitive detection units 110_1~110_n according to the fluid detection signals Sfd1~Sfdn and generates a third status indication signal Ssi3 indicating the spread velocity of the fluid. For example, if the fluid spreads along the detection direction D and submerges/contacts the capacitive detection units 110_1 and 110_2 sequentially, the sensing circuit 120 could obtain the time points that the fluid submerges/contacts the capacitive detection units 110_1 and 110_2 according to the fluid detection signals Sfd1 and Sfd2, and thus calculate the time difference. Therefore, the sensing circuit 120 could calculate the spread velocity of the fluid along the detection direction D according to the interval of the capacitive detection unit 110_1 and 110_2 (defined by the designer) and the time difference.

It should be noted that, both of the aforementioned status alert module 130 and the environment detection unit SDU are optionally configured in the fluid detection apparatus 100, but the invention is not limited thereto. In a exemplary embodiment, the sensing circuit 120 can also emit the first status indication signal Ssi1 to a smart power supply (not shown, but it will be specifically described in the following embodiment), and transmit the alarm signal to the user's electronic devices, such as personal computer or mobile telephone, through the smart power supply by the wired or wireless communication method. In another exemplary embodiment, the capacitive detection units 110_1~110_n could be individually disposed in the fluid detection apparatus 100 without disposing the environment detection unit SDU. The configuration of the fluid detection apparatus 100 depends on the design requirement.

Figure 2A:
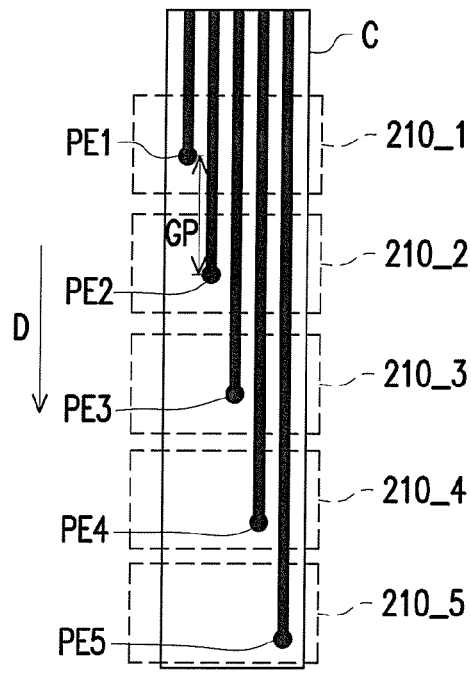
FIG. 2A is a schematic diagram of a configuration of capacitive detection units of one embodiment of the invention.
Figure 2B:
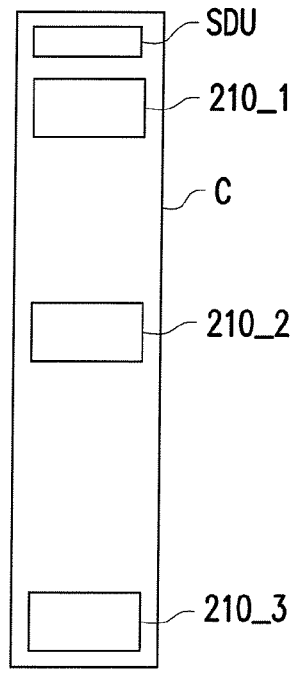
FIG. 2B is a schematic diagram of the configuration of the capacitive detection units of one embodiment of the invention.

The specific configuration of the capacitive detection units could be shown in FIG. 2A or FIG. 2B. Referring to FIG. 2A, in the present embodiment, the capacitive detection units 210_1~210_5 is constructed by a plurality of patterned electrodes PE1~PE5 formed on detection carrier C (such as substrate). The patterned electrodes PE1~PE5 are sequentially disposed on the detection carrier C based on a preset interval GP. Each of the patterned electrodes PE1~PE5 transmits the corresponding fluid detection signal Sfd1~Sfd5 to an external cable interface via conductor patterns, and then the fluid detection signals Sfd1~Sfd5 are transmitted to the sensing circuit 120 via the cable interface.

In the present embodiment, each of the patterned electrodes PE1~PE5 has a specific sensing region (shown as dashed box in FIG. 2A), so as to sense the impedance variation of the corresponding specific region. Therefore, the sensing region of each of the patterned electrodes PE1~PE5 is equivalent to each of the capacitive detection unit 210_1~210_5 that is sequentially disposed on the detection carrier C according to the preset interval GP.

Referring to FIG. 2B. FIG. 2B is a schematic diagram of the configuration of the capacitive detection unit of one embodiment of the invention. The capacitive detection units 210_1~210_3 of the embodiment could apply the electrode patterns similar with the electrode patterns shown in FIG. 2A or use another different electrode pattern, the invention is not limited thereto. To be more specific, the difference between the capacitive detection units 210_1~210_5 shown in the present embodiment and the aforementioned embodiment in FIG. 2 is that the environment detection unit SDU is further disposed on the detection carrier C. By this configuration, the corresponding signals generated by the environment detection unit SDU and the capacitive detection units 210_1~210_3 can be collectively transmitted to an external part via the interface cable.

In addition, the fluid detection apparatus 100 of the present embodiment can be applied with a fluid regulating apparatus for regulating fluid flow, so as to further detect whether the fluid regulating apparatus is in normal operating condition.

Figure 3:
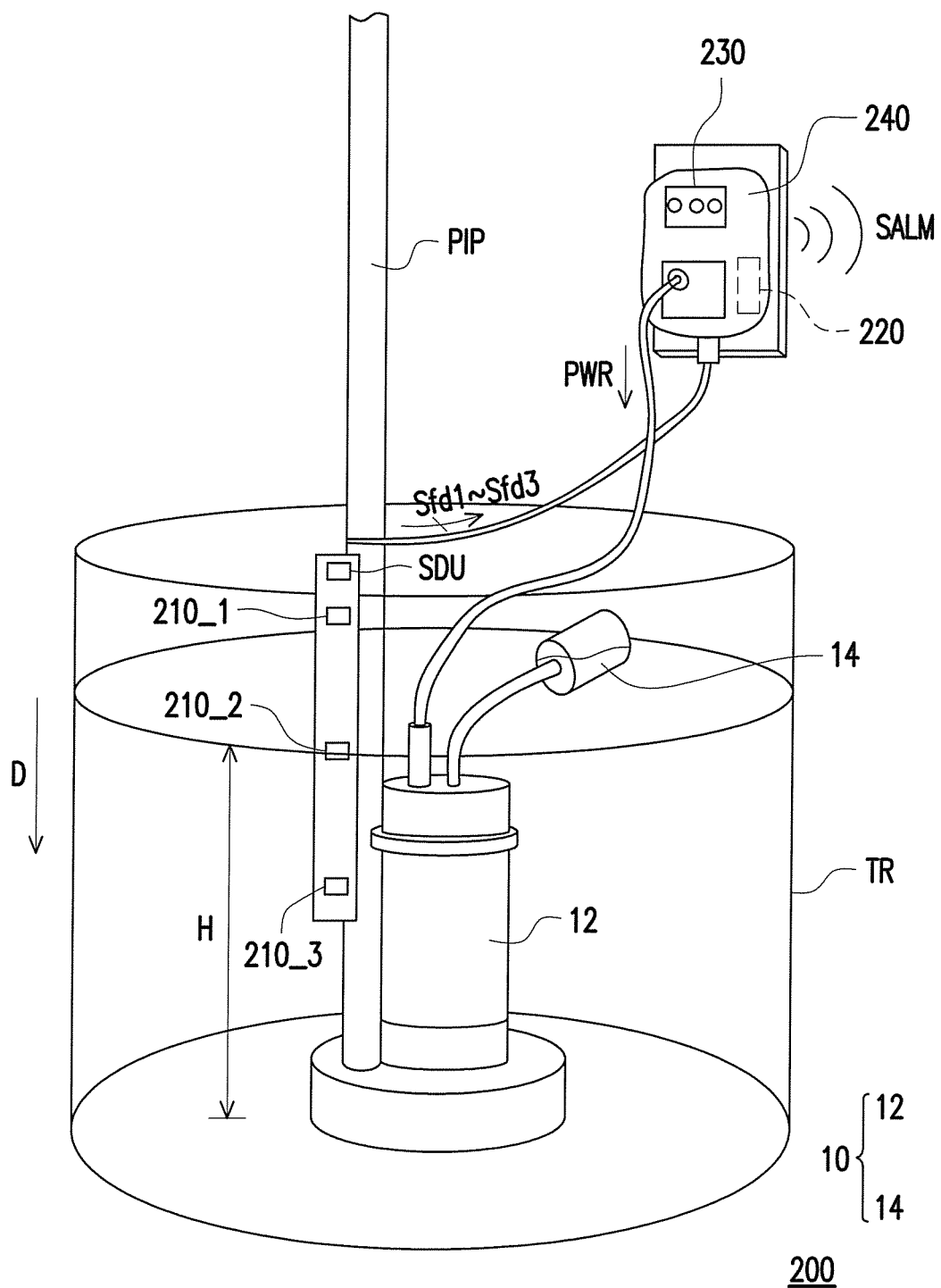
FIG. 3 is a schematic view of an application environment of the fluid detection apparatus according to the embodiment in FIG. 2B.

To further clearly describe the application environment of the fluid detection apparatus in the present embodiment, an example embodiment in FIG. 3 is described as below. FIG. 3 is a schematic view of an application environment of a fluid detection apparatus 200 according to the embodiment in FIG. 2B, but the invention is not limited thereto.

The fluid regulating apparatus in the present embodiment is, for example, a pump 10, but the invention is not limited thereto. The fluid detection apparatus 200 is applied for detecting water level in the basement and detecting the function of the pump 10 which is installed in the basement. The pump 10 includes a submersible motor 12 and a float switch 14. The pump 10 is generally set in a trough-shaped region TR that is located below the ground.

Referring to FIG. 3, the fluid detection apparatus 200 of the embodiment includes the capacitive detection units 210_1~210_3 configured on the detection carrier C, the environment detection unit SDU, the sensing circuit 220, the status alert module 230, and the smart power supply 240. The sensing circuit 220, the status alert module 230, and the smart power supply 240 are shown as an integrated configuration, but the invention is not limited thereto.

In the present embodiment, the detection carrier C could be attached on a pipeline PIP. Based on the fixed interval, the capacitive detection units 210_1~210_2, and 210_3 are sequentially configured on the detection carrier C along the detection direction D (the direction from the water surface to inside the water), where the capacitive detection units 210_1~210_2, and 210_3 are adapted to indicate a high water level condition, a float starting condition, and a low water level condition respectively. The configuration and the function of the sensing circuit 220 and the status alert module 230 are similar to the configuration and the function of the sensing circuit 120 and the status alert module 130 in the embodiment described in FIG. 1, so that detailed descriptions thereof are not repeated.

To be more specific, when the leaking and flooding circumstance happen in the basement, the water level inside the trough-shaped region TR increases gradually. When the water level of the trough-shaped region TR reaches a starting height H, the float switch 14 is separated from the submersible motor 12. When the pump 10 is under normal operating condition, the submersible motor 12 comes into operation in response to the separation of the float switch 14, so as to pump out the water inside the trough-shaped region TR and thus decrease the water level of the trough-shaped region TR.

However, if the pump 10 is malfunction and the water level of the trough-shaped region TR increases gradually to the starting height H, the submersible motor 12 doesn't start in response to the separation of the float switch 14 so that the pump 10 couldn't solve the flooding condition punctually, and the user couldn't be aware of the flooding situation that is happening.

In the present embodiment, the sensing circuit 220 could determine that the water level of the trough-shaped region TR raises over the capacitive detection unit 210_1 indicating the high water level condition according to the fluid detection signals Sfd1~Sfd3. When the water level raises over the capacitive detection unit 210_1, that means the submersible motor 12 doesn't start normally and the water level continues to increase. Therefore, the sensing circuit 220 emits the first status indication signal Ssi1 indicating the high water level condition to the status alert module 230, and thus the status alert module 230 emits the alarm.

Except the above-mentioned fluid detection method, in the present embodiment, the smart power supply 240 can be applied in the fluid detection apparatus 200 for providing a more accurate detection of the fluid and a faster indication to the user that the abnormal condition happens in the specific detection environment.

To be specific, the smart power supply 240 is coupled to the sensing circuit 220. The smart power supply 240 is configured to supply power to the pump 10 and detect a power supply condition of the supplied power for determining whether the pump 10 is in a normal operating condition. The smart power supply 240 further has the communication function, so as to transmit the alarm signal SALM, via the wired or wireless communication method, to the user's electronic devices to notice the user that the flooding condition could be happening in the basement.

To be more specific, when the water level inside the trough-shaped region TR raises over the capacitive detection unit 210_2 indicating the float starting condition, it means the water level inside the trough-shaped region TR reaches the starting height H. At this condition, the sensing circuit 220 emits the corresponding first status indication signal Ssi1 to the smart power supply 240. When the smart power supply 240 receives the first status indication signal Ssi1 indicating water level reaching the starting height H, the smart power supply 240 detects its own power supply condition and determines whether the pump 10 starts to operate. When the pump 10 is in normal operating condition, the smart power supply 240 could detect the operation power PWR is provided to the pump 10. On the contrary, when the pump 10 is not in normal operating condition and the power is not consumed, the smart power supply 240 could detect the operation power PWR that is not provided to the pump 10.

Based on the above, when the smart power supply 240 determines that the pump 10 is not in the normal operating condition according to the power supply condition, the smart power supply 240 may reset the power supply, and therefore, restart the pump 10.

In the present embodiment, the smart power supply 240 determines whether the malfunction of the pump 10 is solved according to power supply condition after reset. If the smart power supply 240 determines that the pump 10 is not in the normal operating condition so, it represents the malfunction of the pump 10 couldn't be solved. Therefore, the smart power supply 240 may emit an alarm signal SALM to notify the user about the occurring condition.

Similarly, in case of the environmental condition inside the trough-shaped region TR exceeds a preset critical condition, the smart power supply 240 may emit the corresponding alarm signal SALM to notice the user based on the second status indication signal Ssi2.

Based on the above, since the smart power supply 240 determines the condition based on the first status indication signal Ssi1 and/or the second status indication signal Ssi2 incorporated with the power supply condition, the abnormal condition can be immediately detected when the water level reaches the starting height H. It is unnecessary for emitting the alarm ALM or the alarm signal SALM waiting until the water level increases to the height of the capacitive detection unit 210_1. Therefore, the immediately fluid detection mechanism can be implemented.

Figure 4:
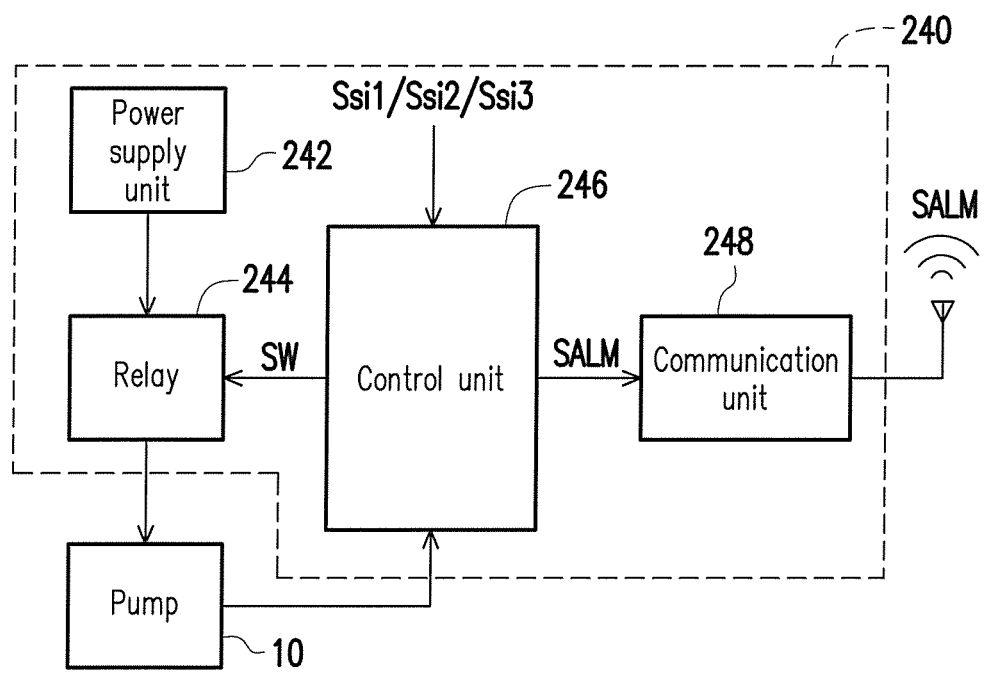
FIG. 4 is a schematic diagram of a smart power supply of one embodiment of the invention.

A specific embodiment of the smart power supply 240 is further described below in the FIG. 4. FIG. 4 is a schematic diagram of a smart power supply of one embodiment of the invention.

Referring to FIG. 3 and FIG. 4, the smart power supply 240 includes a power supply unit 242, a relay 244, a control unit 246, and a communication unit 248. The power supply unit 242 is configured to generate an operation power PWR and to supply power to the pump 10.

The relay 244 is coupled between the power supply unit 242 and the pump 10. The relay 244 is controlled by a switching signal SW generated by the control unit 246 and the switching conducting state to decide whether the operation power PWR is provided to the pump 10.

The control unit 246 is coupled to the sensing circuit 220, the pump 10, and the relay 244. The control unit 246 is the control center of the smart power supply 240 and could detect the power supply condition of the operation power PWR provided to the pump 10. In addition, the control unit 246 is configured to emit the alarm signal SALM and the switching signal SW according to the power supply condition and the first status indication signal Ssc1, the second status indication signal Ssc2 and/or the third status indication signal Ssc3 received from the sensing circuit 220.

The communication unit 248 is coupled to the control unit 246 and configured to transmit the received alarm signal SALM to the electronic device of the user by the wired or wireless communication method. For example, the communication unit 248 could be Wi-Fi module, bluetooth module, and any wire interface or any combination of wire interface, but the invention is not limited thereto.

Figure 5:
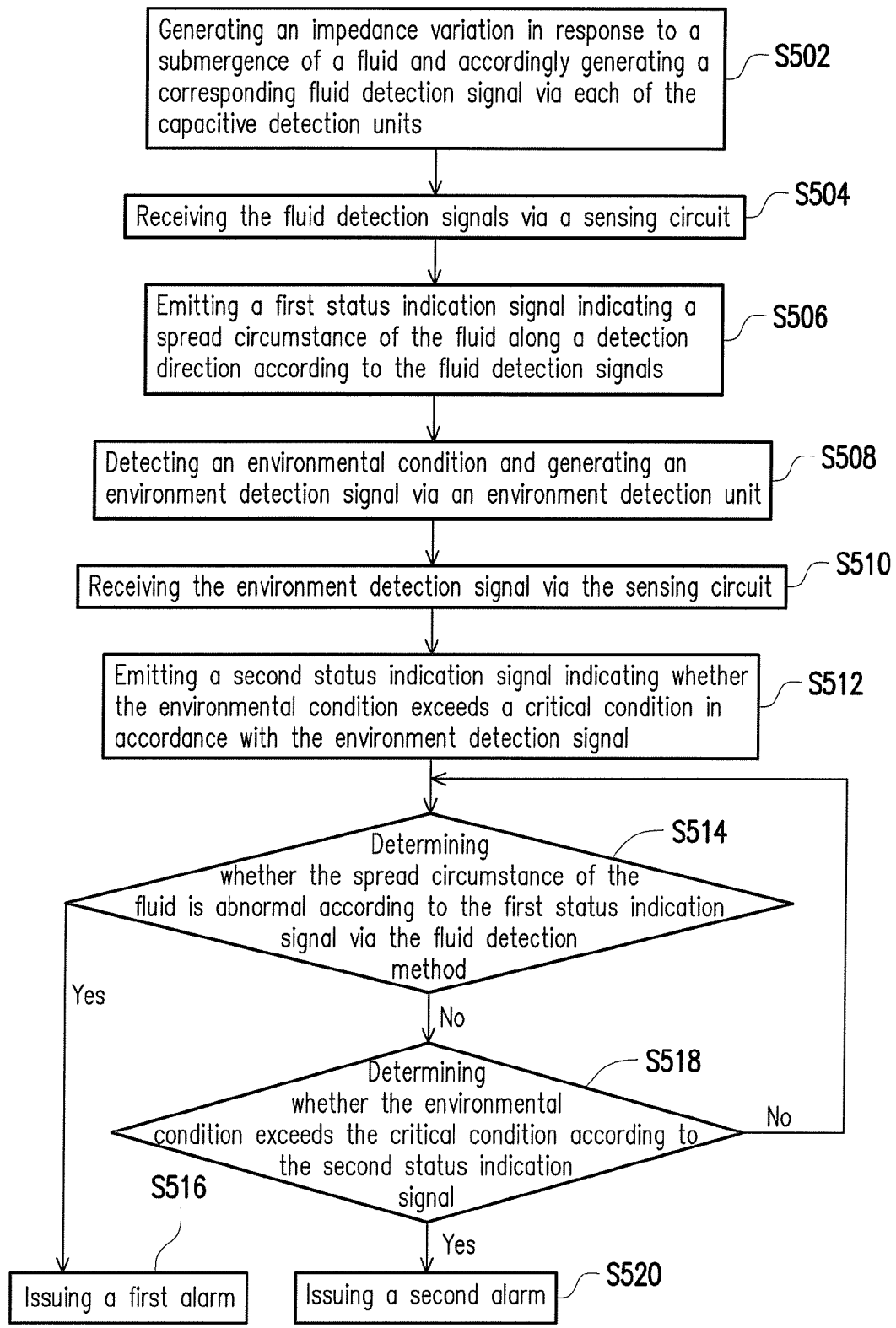
FIG. 5 is a flow chart of steps of a fluid detection method of one embodiment of the invention.

FIG. 5 is a flow chart of steps of a fluid detection method of one embodiment of the invention. The fluid detection method of the present embodiment can be applied for the fluid detection apparatus 100 and 200 that includes a plurality of capacitive detection units (such as 110_1~110_n~210_1~210_5) and a sensing circuit (such as 120~220) as shown in FIG. 1, FIG. 2A, FIG. 2B, and FIG. 3, but the invention is not limited thereto.

Referring to FIG. 5, in this fluid detection method of this embodiment, firstly, each of the capacitive detection units generates an impedance variation in response to a submergence of a fluid and accordingly generates a corresponding fluid detection signal (step S502). After that, the sensing circuit receives the fluid detection signals (step S504), and emitting a first status indication signal indicating a spread circumstance of the fluid along the detection direction according to the fluid detection signals (step S506). On the other hand, after the step S506, the fluid detection method further includes the following steps: the environment detection unit detects an environmental condition and generates an environment detection signal (step S508), and the sensing unit receives the environment detection signal (step S510) and emits a second status indication signal that whether the environmental condition exceeds a critical condition in accordance with the environment detection signal (step S512).

After obtaining the first status indication signal and the second status indication signal, the fluid detection method determines whether the spread circumstance of the fluid is abnormal according to the first status indication signal (step S514). If the abnormal spread circumstance of the fluid is determined, the corresponding first alarm is emitted (step S516).

On the other hand, the spread circumstance of the fluid is not in the abnormal condition, the fluid detection method further determine whether the environmental condition exceeds the critical condition (step S518) according to the second status indication signal. If the environmental condition exceeding the critical condition is determined, the corresponding second alarm is emitted (step S520).

It is noted that, the steps from S510 to S514, step 518, and step 520 in the present embodiment could be optional, but the invention is not limited thereto. In the present embodiment, the detection may not be performed on the environmental condition.

Figure 6:
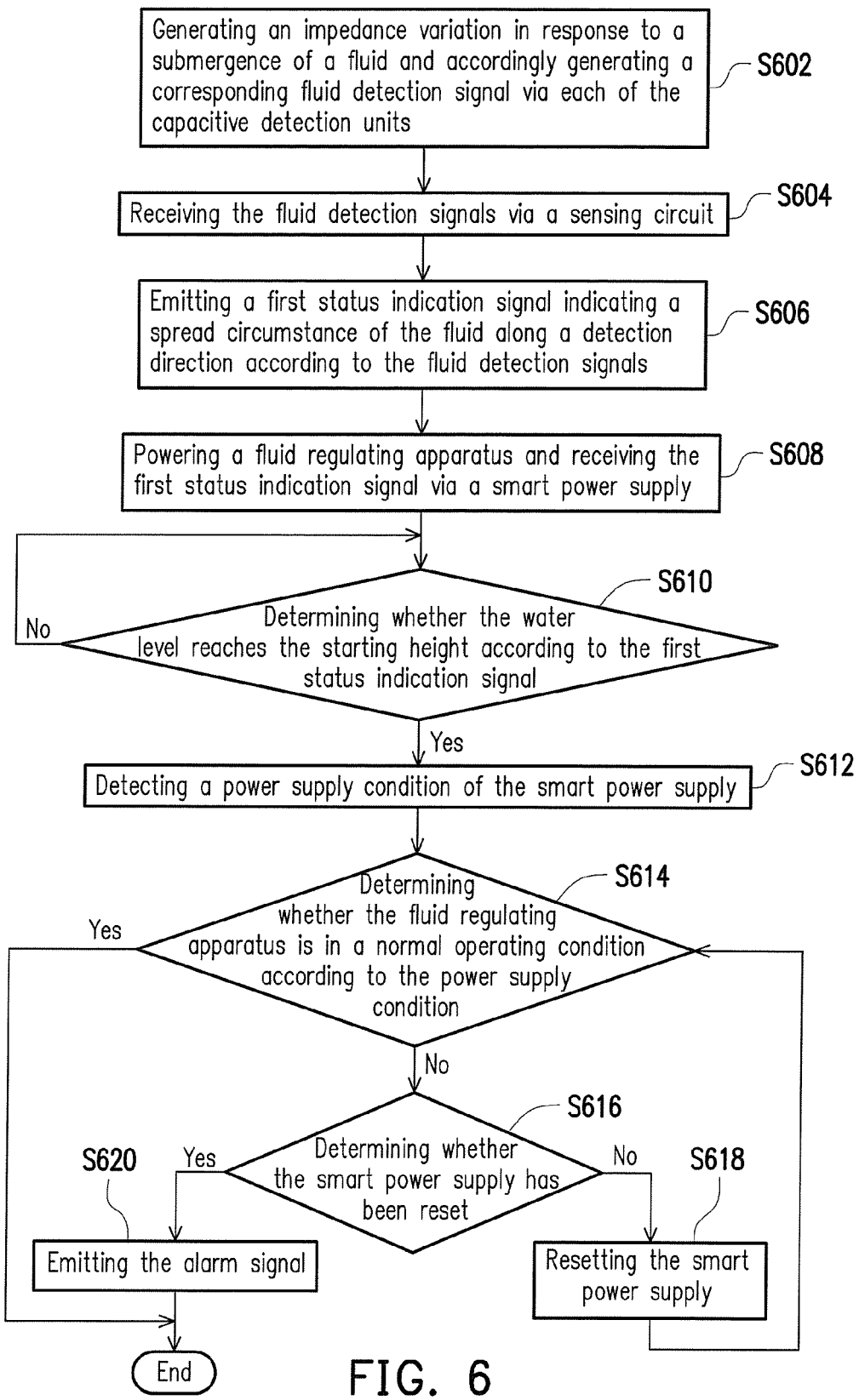
FIG. 6 is a flow chart of steps of a fluid detection method of another embodiment of the invention.

FIG. 6 is a flow chart of steps of a fluid detection method of one embodiment of the invention. The fluid detection method in the present embodiment could apply for the fluid detection apparatus 200 having the smart power supply 240 as shown in FIG. 3, but the invention is not limited thereto.

Referring to FIG. 6, in the present embodiment, firstly, each of the capacitive detection units (such as 210_1~210_3) generates an impedance variation in response to the submergence of the fluid and accordingly generates a corresponding fluid detection signal (step S602). After that, the sensing circuit (such as 220) receives the fluid detection signals (step S604), and emits a first status indication signal indicating a spread circumstance of the fluid along the detection direction according to the fluid detection signals (step S606). On the other hand, the fluid detection method further includes: the smart power supply (such as 240) powers a fluid regulating apparatus (such as 10) and receives the first status indication signal (step S608).

Thereafter, the smart power supply determines whether the water level reaches the starting height according to the first status indication signal (step S610). The smart power supply detects its own power supply condition (S612) and determines whether the fluid regulating apparatus is in a normal operating condition according to the detected power supply condition (step S614).

If the smart power supply decides (determine) that the fluid regulating apparatus is not in the normal operating condition, the smart power supply further determines that whether it has been reset (step S616). If the reset is not performed, the smart power supply will be commanded to reset (step S618), and return to determine whether the water level reaches the starting height of the step S610. On the contrary, if the malfunction is not solved after reset the smart power supply, the smart power supply will further emit an alarm signal (step S620) to notify the user about the potential leaking and flooding circumstance.

The embodiment of the fluid detection method shown in FIG. 5 and FIG. 6 can be fully supported and taught by the illustration of FIGS. 1 to 4, therefore, the similar or the same features are not further described hereinafter.

In summary, the embodiment of the invention provides the fluid detection apparatus and the fluid detection method that includes the capacitive detection units. The capacitive detection units are sequentially arranged along a specific detection direction and are able to generate impedance variations in response to the submergence of the fluid. The detection of the spread circumstance of the fluid can be realized through sensing the fluid detection signals returned by the capacitive detection unit. In addition, through detecting the spread circumstance of the fluid and the power supply condition, the fluid detection apparatus and the fluid detection method of the embodiments could further immediately and accurately determine that whether the pump of the fluid regulating apparatus is in the malfunction condition.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

What is claimed is:

1. A fluid detection apparatus, comprising:
   a plurality of capacitive detection units, sequentially arranged along a detection direction, wherein each of the capacitive detection units generates an impedance variation in response to a submergence of a fluid and accordingly generates a corresponding fluid detection signal;
   a sensing circuit, coupled to the capacitive detection units so as to receive the fluid detection signals and emit a first status indication signal indicating a spread circumstance of the fluid along the detection direction according to the fluid detection signals; and
   a smart power supply, coupled to the sensing circuit, wherein the smart power supply is configured to supply power to a fluid regulating apparatus and detect a power supply condition to determine whether the fluid regulating apparatus is in a operating condition, wherein the smart power supply decides whether to reset so as to restart the fluid regulating apparatus according to the first status indication signal and the power supply condition.

2. The fluid detection apparatus as recited in claim 1, further comprising:
   a detection carrier, wherein the capacitive detection units are sequentially disposed on the detection carrier based on a preset interval.

3. The fluid detection apparatus as recited in claim 2, further comprising:
   an environment detection unit, disposed on the detection carrier and coupled to the sensing circuit, and configured to detect an environmental condition and generate an environment detection signal, wherein the sensing circuit emits a second status indication signal indicating whether the environmental condition exceeds a critical condition in accordance with the environment detection signal.

4. The fluid detection apparatus as recited in claim 3, further comprising:
a status alert module, coupled to the sensing circuit, and configured to determine whether to issue an alarm according to at least one of the first status indication signal and the second status indication signal.

5. The fluid detection apparatus as recited in claim 1, wherein the smart power supply emits an alarm signal when the smart power supply determines that the fluid regulating apparatus is not in the normal operating condition.

6. The fluid detection apparatus as recited in claim 1, wherein the smart power supply comprises:
a power supply unit, configured to supply power to the fluid regulating apparatus;
a relay, coupled between the power supply unit and the fluid regulating apparatus, wherein the relay is controlled by a switching signal to decide whether an operation power is provided to the fluid regulating apparatus;
a control unit, coupled to the sensing circuit, the fluid regulating apparatus, and the relay, wherein the control unit is configured to detect the power supply condition provided to the fluid regulating apparatus, and emit the alarm signal and the switching signal according to the power supply condition and the first status indication signal; and
a communication unit, coupled to the control unit, wherein the communication unit is configured to transmit the alarm signal by a wired or wireless communication method.

7. The fluid detection apparatus as recited in claim 1, wherein the sensing circuit calculates a time difference of the fluid flowing through two of the capacitive detection units according to the fluid detection signals and generates a third status indication signal indicating a spread velocity of the fluid.

8. A fluid detection method, applied for a fluid detection apparatus, wherein the fluid detection apparatus comprises a plurality of capacitive detection units, a smart power supply and a sensing circuit, the fluid detection method comprises:
generating an impedance variation in response to a submergence of a fluid and accordingly generating a corresponding fluid detection signal via each of the capacitive detection units;
receiving the fluid detection signals via the sensing circuit;
emitting a first status indication signal indicating a spread circumstance of the fluid along the detection direction according to the fluid detection signals;
supplying power to a fluid regulating apparatus and receiving the first status indication signal via the smart power supply;
detecting a power supply condition of the smart power supply;
determining whether the fluid regulating apparatus is in a normal operating condition according to the power supply condition; and
deciding whether to reset the smart power supply and restart the fluid regulating apparatus according to the first status indication signal and the power supply condition.

9. The fluid detection method as recited in claim 8, wherein the fluid detection apparatus further comprises an environment detection unit, and the fluid detection method further comprises:
detecting an environmental condition and generating an environment detection signal via an environment detection unit;
receiving the environment detection signal via the sensing unit; and
emitting a second status indication signal indicating whether the environmental condition exceeds a critical condition in accordance with the environment detection signal.

10. The fluid detection method as recited in claim 9, further comprising:
deciding whether to emit an alarm according to at least one of the first status indication signal and the second status indication signal.

11. The fluid detection method as recited in claim 8, further comprising:
determining whether the fluid regulating apparatus is in the normal operating condition according to the power supply condition after the smart power supply is reset; and
emitting an alarm signal when the fluid regulating apparatus is not in the normal operating condition after the smart power supply is reset.

12. The fluid detection method as recited in claim 8, further comprising:
calculating a time difference of the fluid flowing through two of the capacitive detection units via the sensing circuit; and
generating a third status indication signal indicating a spread velocity of the fluid according to the time difference.

* * * * *